US 6,556,009 B2

(12) United States Patent
Kellman et al.

(10) Patent No.: US 6,556,009 B2
(45) Date of Patent: Apr. 29, 2003

(54) ACCELERATED MAGNETIC RESONANCE IMAGING USING A PARALLEL SPATIAL FILTER

(75) Inventors: Peter Kellman, Bethesda, MD (US); Elliot McVeigh, Phoenix, MD (US)

(73) Assignee: The United States of America as represented by the Department of Health and Human Services, Washington, DC (US)

( * ) Notice: Subject to any disclaimer, the term of this patent is extended or adjusted under 35 U.S.C. 154(b) by 0 days.

(21) Appl. No.: 09/735,263

(22) Filed: Dec. 11, 2000

(65) Prior Publication Data

US 2002/0097050 A1 Jul. 25, 2002

(51) Int. Cl.⁷ .................................................. G01V 3/00
(52) U.S. Cl. ..................... 324/309; 324/307; 324/318; 324/322; 382/260
(58) Field of Search ................................ 324/309, 307, 324/306, 318, 300, 322; 600/410, 443; 382/260–264

(56) References Cited

U.S. PATENT DOCUMENTS

| | | | |
|---|---|---|---|
| 4,710,717 A | | 12/1987 | Pelc et al. |
| 4,720,678 A | | 1/1988 | Glover et al. |
| 4,901,019 A | * | 2/1990 | Wedeen ...................... 324/309 |

(List continued on next page.)

FOREIGN PATENT DOCUMENTS

WO    WO 01/44827 A2    2/1999

OTHER PUBLICATIONS

Griswold MA, Jakob PM, Edelman RR, Sodickson DK. Alternative EPI acquisition strategies using SMASH. *Proc. Intl. Soc. Magn Reson Med* 1998;423.

Farzaneh F, Riederer SJ, Pelc NJ. Analysis of T2 limitations and off–resonance effects on spatial resolution and artifacts in echo–planar imaging. *Magn Reson Med* 1990; 14:123–139.

McKinnon GC, Ultrafast interleaved gradient–echo–planar imaging on a standard scanner, *Magn Reson Med* 1993; 30: 609–616.

Feinberg DA, Oshio K. Phase errors in multi–shot echo planar imaging. *Magn Reson Med* 1994; 32:535–539.

Reeder SB, Atalar E, Bolster BD Jr, McVeigh ER. Quantification and reduction of ghosting artifacts in interleaved echo–planar imaging. *Magn Reson Med* 1997; 38:429–439.

Reeder SB, Atalar E, Faranesh AZ, McVeigh ER. Multi–echo segmented k–space imaging: an optimized hybrid sequence for ultrafastcardiac imaging. *Magn Reson Med* 1999; 4:375–385.

(List continued on next page.)

*Primary Examiner*—Edward Lefkowitz
*Assistant Examiner*—Dixomara Vargas
(74) *Attorney, Agent, or Firm*—Klarquist Sparkman, LLP (57) ABSTRACT

An apparatus and method for accelerating magnetic resonance imaging by decreasing the number of sequential phase encodes (undersampling). Image reconstruction of undersampled k-space data can cause ghost artifacts to be produced in the resulting sequence of images. A combination of temporal and spatial filters are used to substantially suppress the ghost artifacts. Additionally, the spatial filter receives spatial filter coefficients used in the filtering process. The spatial filter coefficients are adaptively or dynamically generated so that the coefficients are provided to the spatial filter while generating the sequence of images.

19 Claims, 7 Drawing Sheets

U.S. PATENT DOCUMENTS

| | | | |
|---|---|---|---|
| 4,937,526 A | | 6/1990 | Ehman et al. |
| 5,109,854 A | * | 5/1992 | Provost ..................... 324/309 |
| 5,138,259 A | | 8/1992 | Schmitt et al. |
| 5,208,534 A | | 5/1993 | Okamoto et al. |
| 5,304,929 A | | 4/1994 | Fang et al. |
| 5,323,110 A | | 6/1994 | Fielden et al. |
| 5,351,305 A | | 9/1994 | Wood et al. |
| 5,431,163 A | | 7/1995 | Kajiyama |
| 5,475,355 A | * | 12/1995 | Abele et al. ................. 324/320 |
| 5,485,086 A | * | 1/1996 | Meyer et al. ................ 324/307 |
| 5,515,852 A | | 5/1996 | Karp et al. |
| 5,644,646 A | * | 7/1997 | Du et al. .................... 324/308 |
| 5,647,370 A | | 7/1997 | Harnoncourt |
| 5,653,233 A | | 8/1997 | Pelc et al. |
| 5,657,758 A | * | 8/1997 | Posse et al. ................. 324/307 |
| 5,667,373 A | | 9/1997 | Wright et al. |
| 5,697,370 A | | 12/1997 | Pelc et al. |
| 5,709,210 A | * | 1/1998 | Green et al. ................. 600/453 |
| 5,722,409 A | | 3/1998 | Kuhara et al. |
| 5,729,140 A | | 3/1998 | Kruger et al. |
| 5,846,202 A | * | 12/1998 | Ramamurthy et al. ...... 600/450 |
| 5,909,516 A | * | 6/1999 | Lubin ......................... 382/260 |
| 5,910,728 A | * | 6/1999 | Sodickson .................. 324/309 |
| 5,974,159 A | * | 10/1999 | Lubin et al. ................. 382/106 |
| 5,976,088 A | * | 11/1999 | Urbano et al. ............... 600/443 |
| 6,043,651 A | | 3/2000 | Heid |
| RE36,679 E | | 5/2000 | Zakhor et al. |
| 6,086,537 A | * | 7/2000 | Urbano et al. ............... 600/443 |
| 6,137,904 A | * | 10/2000 | Lubin et al. ................. 382/162 |
| 6,144,873 A | * | 11/2000 | Madore et al. .............. 600/410 |
| 6,228,030 B1 | * | 5/2001 | Urbano et al. ............... 600/443 |
| 6,289,232 B1 | * | 9/2001 | Jakob et al. ................. 324/307 |
| 6,360,022 B1 | * | 3/2002 | Lubin et al. ................. 382/219 |

OTHER PUBLICATIONS

D.H. Johnson, D.E. Dudgeon, Array Signal Processing: Concepts and Techniques, New Jersey: Prentiss–Hall; 1993. pp. 355–371.

A. Oppelt, R. Graumann, H. Barfuss, H. Fischer, W. Hartl, W. Shajor, "FISP—a new fast MRI sequence," *Electromedica*, 1986; 54:15–18.

P.B. Roemer, W.A. Edelstein, C.E. Hayes, S.P. Souza, O.M. Mueller, "The NMR phased array," *Magn Reson Med*, 1990;16:192–225.

Golay et al., *PRESTO–SENSE: An Ultrafast Whole–Brain fMRI Technique*. Magn Reson Med. Jun. 2000; 43(6): 779–86.

Pruessmann et al., *SENSE: Sensitivity Encoding for Fast MRI*. Magn Reson Med. Nov. 1999; 42(5): 952–962.

Madore et al., *Unaliasing by Fourier–Encoding the Overlaps Using the Temporal Dimension [UNFOLD], Applied to Cardiac Imaging and fMRI*. Magn Reson Med. Nov. 1999; 42(5):813–2.

Koestler et al., *Heart Perfusion Imaging Using SENSE*, 2000 Scientific Program, Radiological Society of North America, 85th Scientific Assembly and Annual Meeting, Nov. 26–Dec. 1, 2000, Chicago, Illinois.

S. Kuhara et al., *A Novel EPI Reconstruction Technique using Multiple RF Coiul Sensitivity Maps*.

Walsh, David O., et al., *Adaptive Reconstruction of Phased Array MR Imagery*, Magnetic Resonance in Medicine 43:682–690 (2000).

Xin Wan et al., *Reduction of Geometric and Intensity Distortions in Echo–Planar maging Using a Multireference Scan*, MRM 37:932–944 (1997).

Xin Wan et al., *Reduction of Phase Error Ghosting Artifacts in Thin Slice Fast Spin–Echo Imaging*, MRM 34:632–638 (1995).

Feinberg et al., *Phase Errors in Multi–Shot Echo Planar Imaging*, MRM 32:535–539 (1994).

Wetter et al., *Cardiac Echo–planar MR Imaging: Comparison of Single–and Multiple–shot Techniques*, Department of Radiology, University Hospital Zurich, from the 1994 RSNA Scientific Assembly.

Buonocore et al., *High Spatial Resolution EPI Using an Odd Number of Interleaves*, MRM 41:1199–1205 (1990).

Sodickson, Daniel K., Manning, Warren J., "Simultaneous Acquisition of Spatial Harmonics (SMASH): Fast Imaging with Radiofrequency Coil Arrays", *MRM 38:591–603 (1997)*.

Carlson, Blair D., "Covariance Matrix Estimation Errors and Diagonal Loading in Adaptive Arrays", *IEEE Transactions on Aerospace and Electronic Systems*, 1988;24:397–401.

Haykin, Simon, "Adaptive Filter Theory", Third Edition, New Jersey: *Prentice Hall Information and System Sciences Series*.

Heidemann, R., Griswold, M., et al., "Variable Density AUTO–SMASH Imaging", Physikalisches Institut, Würzburg University, Würzburg, Germany.

Epstein, Frederick H., Wolff, Steven D., Arai, Andrew E., "Segmented k–Space Fast Cardiac Imaging Using an Echo–Train Readout", *Magnetic Resonance in Medicine* 41:609–613 (1999).

Kellman, P., McVeigh, E.R., "Method for Combining UNFOLD with SENSE or SMASH", Laboratory for Cardiac Energetics, *National Heart, Lung and Blood Institute, NIH, Bethesda, MD*.

Weiger, Markus et al., "Specific Coil Design for SENSE: A Six–Element Cardiac Array", *Institute of Biomedical Engineering and Medical Informatics, University and ETH*, Zurich, Switzerland.

Kellman, P., Epstein, McVeigh, Adaptive Sensitivity Encoding Incorporating Temporal Filtering (TSENSE), *Laboratory of Cardiac Energetics, National Institutes of Health, National Heart, Lung and Blood Institute, Bethesda, MD*.

London, J.F., Epstein, F.H., Kellman, P., Wassmuth, R., Arai, A.E., "Exercise Cardiac Stress Testing Using Real–Time MRI", *Scientific Assembly and Annual Meeting, 2000*.

Weiger, M., Pruessmann, K.P., Boesiger, P., "Cardiac Real–Time Imaging Using SENSE", *Magnetic Resonance in Medicine 43:177–184 (2000)*.

Sodickson, D., "Tailored SMASH Image Reconstructions for Robust In Vivo Parallel MR Imaging", *Magnetic Resonance in Medicine 44: 243–251 (2000)*.

Peter Kellman and Elliot R. McVeigh, "Method for Combining UNFOLD with SENSE or SMASH," Proceedings of the International Society for Magnetic Resonance in Medicine, 8th Scientific Meeting and Exhibition, Denver, Co, Apr. 3, 2000, vol. 3, p. 1507

Kellman et al., "Adaptive Sensitivity Encoding Incorporating Temporal Filtering (TSENSE),"Magnetic Resonance in Medicine, 45:846–852 (2001).

Jakob et al., "Auto–Smash: A Self–Calibrating Technique for SMASH Imaging", Magnetic Resonance Materials in Physics, Biology and Medicine 7:42–54 (1998).

* cited by examiner

TIME-VARYING K-SPACE
DATA ACQUISITION WITH
INTERLEAVED SAMPLING

FIG. 4B

TIME-VARYING K-SPACE
DATA ACQUISITION WITH
RANDOM SAMPLING

FIG. 4C

OUTPUT IMAGE DATA

ACCELERATED MAGNETIC RESONANCE IMAGING USING A PARALLEL SPATIAL FILTER

FIELD OF THE INVENTION

The present invention relates generally to Magnetic Resonance Imaging (MRI), and more particularly relates to acceleration of MRI using undersampled k-space data.

BACKGROUND

Magnetic Resonance Imaging is based on the absorption and emission of energy in the radio frequency range. To obtain the necessary MR images, a patient (or other target) is placed in a magnetic resonance scanner. The scanner provides a uniform magnetic field that causes individual magnetic moments of spins in the patient or target to align with the magnetic field. The scanner also includes multiple coils that apply a transverse magnetic field. RF pulses are applied to the coils that cause the aligned moments to be rotated or tipped. In response to the RF pulses, a signal is emitted by the excited spins that is detected by receiver coils.

Figure 1A:
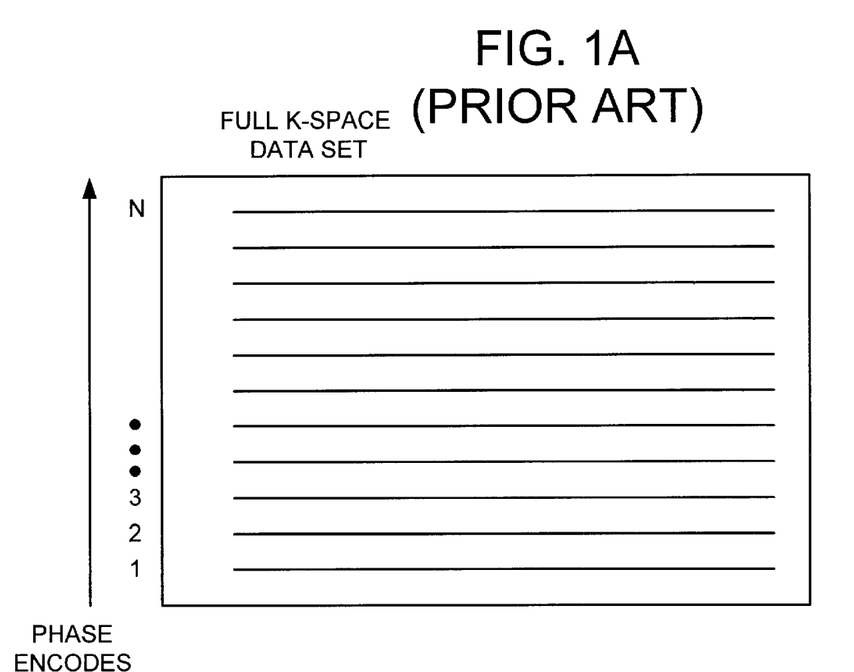
FIG. 1A is an example of a k-space data set with all phase encodes acquired.

The resulting data obtained by the receiver coils corresponds to the spatial frequency domain and is called k-space data. The k-space data includes multiple lines called phase encodes or echoes. Each line is digitized by collecting a number of samples (e.g., 128–256). A set of k-space data is acquired for each image frame, and each k-space data set is converted to an image by passing the data through a fast Fourier transform (FFT) FIG. 1A shows an example of a full k-space data set with all of the phase encodes (1, 2, 3 ... N) acquired.

Figure 1B:
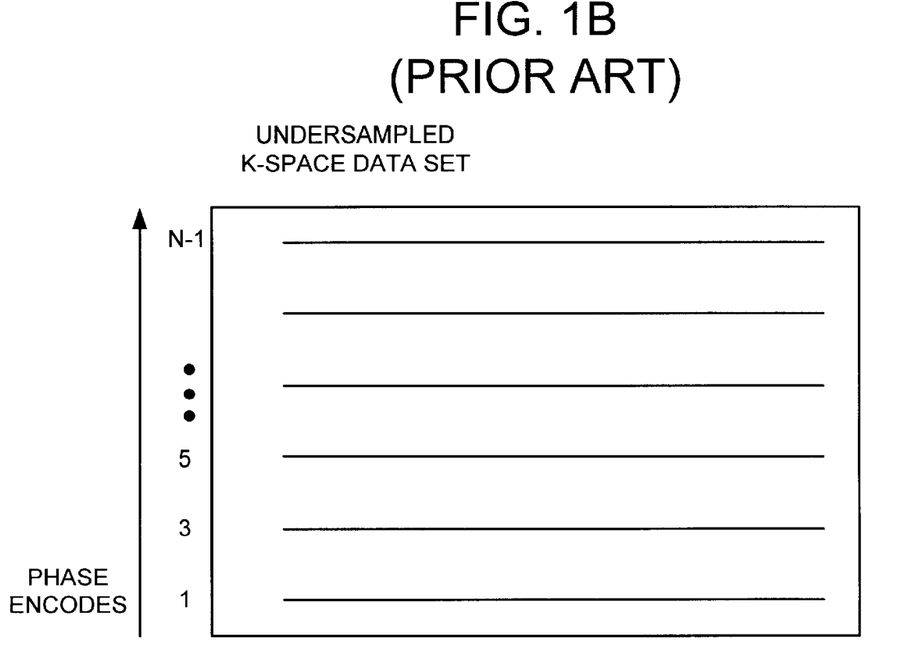
FIG. 1B is an example of an undersampled k-space data set.

In several applications of MRI, a time series or sequence of images are obtained in order to resolve temporal variations experienced by the imaged object. For example, in cardiac imaging it is desirable to obtain a sequence of images to study the dynamic aspects of the heart. Ideally, when objects are imaged, all of the spatial information is obtained as in FIG. 1A. Because this imaging process is slow, methods have been developed that use only part of the k-space data, while the remainder of the data is approximated by interpolation or other means. There are numerous types of such "undersampling" techniques that can be used that acquire only part of the k-space data. For example, the k-space data acquisition may obtain only every other line (e.g., even or odd lines), or fewer lines may be obtained near the boundaries of k-space, while additional lines are obtained around the center. FIG. 1B shows an example of an undersampled k-space data set with only the odd phase encodes acquired. Accelerated imaging refers to fewer samples of k-space are required to reconstruct an image with the same field-of-view and effective spatial resolution.

Typically, when undersampled k-space data is converted to image space the resulting images have aliasing defects called artifacts or ghost artifacts. There are several filtering techniques to reduce the affects of ghost artifacts. One such scheme is called UNFOLD (Madore et al., *Unaliasing by Fourier-Encoding the Overlaps Using the Temporal Dimension* [UNFOLD], *Applied to Cardiac Imaging and fMRI*. Magn Reson Med. 1999 Nov; 42(5):813–28.) UNFOLD acquires half of the k-space lines to accelerate image acquisition. On the first data set of the sequence, UNFOLD acquires odd lines of k-space. On the next data set of the sequence, UNFOLD acquires the even lines of k-space. Such an acquisition process is called a time-varying, alternating acquisition. The aliasing defects resulting from the even and odd k-space acquisition are of opposite sign and are almost cancelled out when combined appropriately, depending on the degree and type of object motion.

Another technique for accelerating MR acquisition is called partially parallel acquisition. Methods in this category are SENSE (Pruessmann et al., SENSE: *Sensitivity Encoding for Fast MRI*. Magn Reson Med. 1999 Nov; 42(5): 952–962.) and SMASH (Sodickson D K, Manning W. *Simultaneous acquisition of spatial harmonics* (SMASH): *fast imaging with radiofrequency coil arrays*. Magn Reson Med 1997; 38:591–603). SENSE and SMASH use undersampled k-space data acquisition obtained from multiple coils in parallel. In these methods, the complex data from multiple coils are combined with complex weightings in such a way as to suppress undersampling artifacts in the final reconstructed image. This type of complex array combining is referred to as spatial filtering, and includes combining which is performed in the k-space domain (as in SMASH) or in the image domain (as in SENSE), as well as methods which are hybrids. Rather than alternating acquisition between even and odd lines as in UNFOLD, SENSE and SMASH use either even lines for all the data sets or odd lines for all the data sets. In either SENSE or SMASH, it is important to know the proper weightings or sensitivities of the coils. Coil sensitivities change based on proximity to the target. Additionally, if the target moves, the coil sensitivities vary. To obtain the coil sensitivities, a calibration run is typically performed prior to and/or after the imaging. It is assumed that the sensitivities of the coils remain static. However, in practice, if the patient moves during the course of the exam, the coil sensitivities change. Even slight motion, such as breathing, can cause sufficient motion to compromise the estimated coil sensitivities.

Figure 2A:
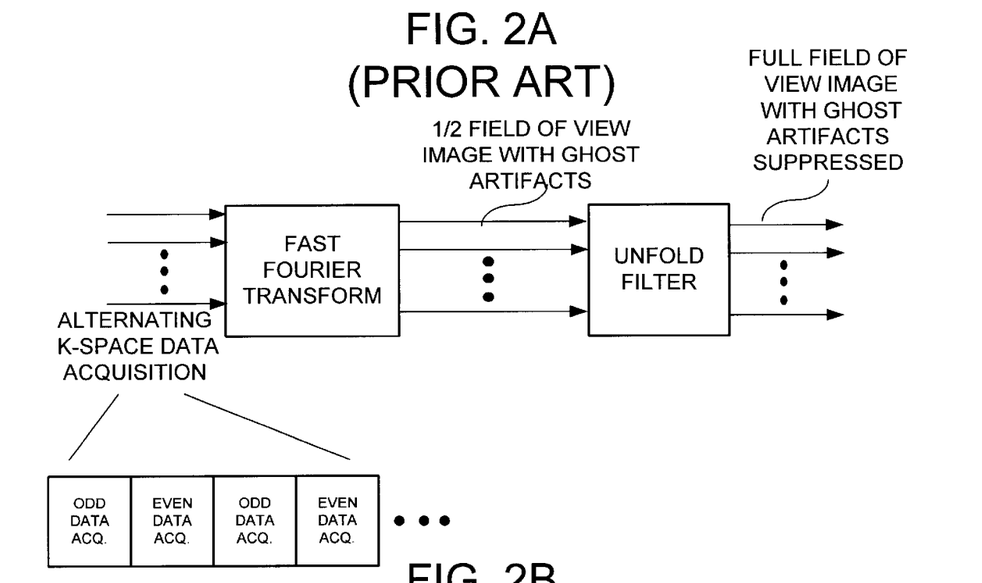
FIG. 2A is a prior art MRI acceleration technique using an UNFOLD temporal filter.
Figure 2B:
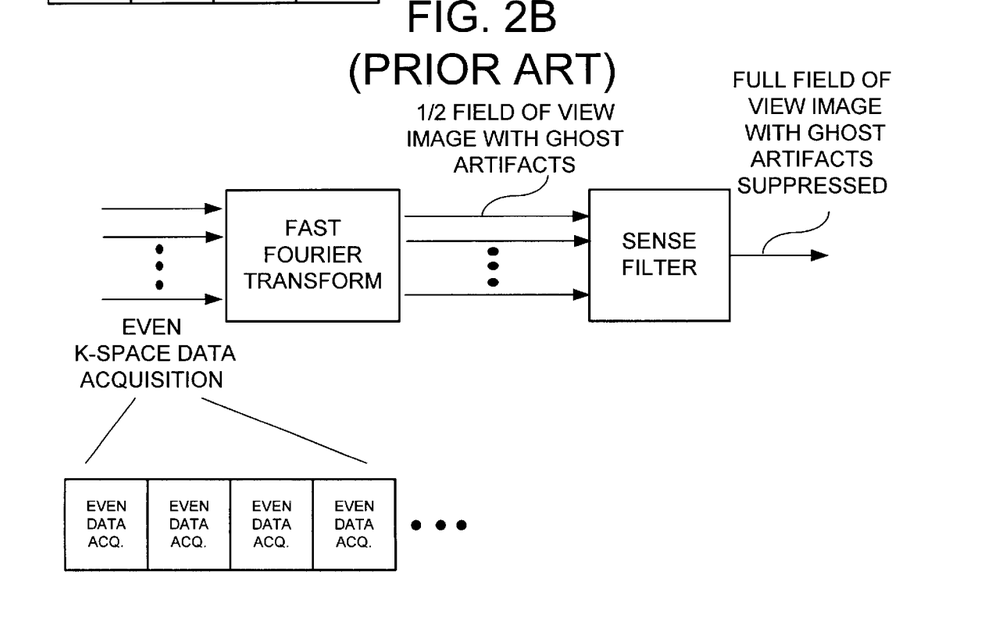
FIG. 2B is a prior art MRI acceleration technique using a SENSE spatial filter.

FIGS. 2A and 2B show high-level diagrams of both the UNFOLD and SENSE filtering techniques. FIG. 2A shows that with the UNFOLD technique, alternating k-space data is converted to the image domain by a fast Fourier transform. After the conversion to the image domain, the images contain ghost artifacts and are only one-half field-of-view. The half field-of-view data is passed through the UNFOLD filter to obtain a full field-of-view image with the ghost artifacts suppressed. The k-space data may be supplied by multiple receiver coils as indicated by the multiple input lines to the fast Fourier transform. For each receiver coil, the UNFOLD filter produces corresponding output image data.

FIG. 2B shows a similar technique using a SENSE filter. In this technique, even k-space data, acquired from multiple coils, is passed through a fast Fourier transform to obtain a half field-of-view image with ghost artifacts. The half field-of-view image is passed through the SENSE filter to obtain a full field-of-view image with the ghost artifacts suppressed.

In either imaging technique of FIGS. 2A and 2B, the filter converts a one-half field-of-view image to a full field-of-view image with ghost artifacts suppressed.

The above mentioned filtering techniques are effective, but the resulting images may still contain residual ghost artifacts that can obscure part of the image. It is desirable to accelerate image acquisition while further suppressing any residual artifacts.

SUMMARY OF THE INVENTION

The present invention relates to a method and apparatus for accelerating MR imaging. Undersampled k-space data is used to achieve an R-fold acceleration. Ghost artifacts that result from undersampling are suppressed by means of combined temporal and spatial filtering. Additionally, the spatial filter coefficients may be adaptively or dynamically computed while imaging so that patient movement or other variations in the sensor coil sensitivity profiles does not unduly affect the image reconstruction.

In one aspect, temporal and spatial filters are combined in series. In this context, spatial filtering refers to the weighted sum of multi-coil data (either in k-space or image space). Undersampled spatial spectral data from multiple coils is converted to image domain data using one of any variety of image reconstruction techniques, such as fast Fourier transforms. The data is then passed through a series combination of temporal and spatial filters. The image reconstruction, temporal filtering, and spatial filtering are linear operations. Consequently, these operations can be performed in virtually any order. Additionally, a wide variety of temporal and spatial filters can be used. UNFOLD and SENSE are examples of such temporal and spatial filters.

In another aspect, the spatial filter coefficients are adaptively or dynamically computed from time-varying, undersampled data acquisition. The spatial filter coefficients are applied dynamically to a spatial filter, which performs a full field-of-view image reconstruction. A temporal filter may be combined in series with the spatial filter to further suppress ghost artifacts, if desired.

Further features and advantages of the invention will become apparent with reference to the following detailed description and accompanying drawings.

DETAILED DESCRIPTION

Overview of System

FIGS. 3A through 3F show multiple embodiments of a system 10 for acceleration of MR acquisition. Each embodiment includes a series combination of a converter 12, a spatial filter 14, and a temporal filter 16. In this context, spatial filtering refers to the weighted sum of multi-coil data (either in k-space or image space). The converter 12 performs image reconstruction by converting frequency domain data to the image domain. Temporal filtering, spatial filtering, and image reconstruction are linear operations and may be performed in any order to achieve equivalent results. Consequently, FIGS. 3A–3F show different embodiments of the invention with the converter, spatial, and temporal filters in different orders. Regardless of the ordering, in each case multi-coil, undersampled, time-varying k-space data is input into the MRI image reconstruction system and a time sequence of images is produced on the output. The time sequence of images can be used in a variety of applications to view changes occurring in time of an imaged object. Such applications include cardiac imaging, functional MRI, and time-resolved angiography, just to name a few.

The converter 12 performs image reconstruction to convert data in the spatial spectral domain into image domain data. The most common technique for image reconstruction is using a fast Fourier transform (FFT). However, other techniques may be used for image reconstruction as is well-understood in the art.

The spatial filter 14 computes a weighted sum of samples received from multiple coils. Thus, the spatial filter combines the outputs of the coils with typically complex weights and adds such weighted outputs together. A wide variety of spatial filters can be used, and are also referred to as phased array coherent combining. In this application of accelerated imaging, the array combining is designed by a variety of methods to suppress ghost artifacts that result from undersampling. Example of array combining (spatial filtering) include SENSE, SMASH, or methods known as blind signal separation. Certain methods such as SENSE assume knowledge (or estimate) the coil sensitivity profiles explicitly, while other methods do not require explicit estimates of the coil sensitivities but rather are based on the statistical properties of the signals themselves. The array processing may be applied in the spatial frequency domain (k-space) as in SMASH, in which missing k-space data is calculated, or in the image domain as in SENSE, where image domain artifacts are suppressed.

The temporal filter 16 is defined as any filter that performs a weighted sum (weighted with an impulse response) over a series of time samples or equivalently performs a temporal interpolation or smoothing by means of filtering or curve fitting. A wide variety of temporal filters may be used such as time domain convolution, temporal frequency domain filter implementations, averaging, integration, temporal interpolation, or frequency domain equivalents. In this context, methods known as "viewsharing" or "tricks" are also considered as temporal filters (interpolators) since they may be expressed equivalently as a weighted sum or other interpolation of k-space with appropriate zero filling of missing data.

k-space Data Acquisition

Figure 7:
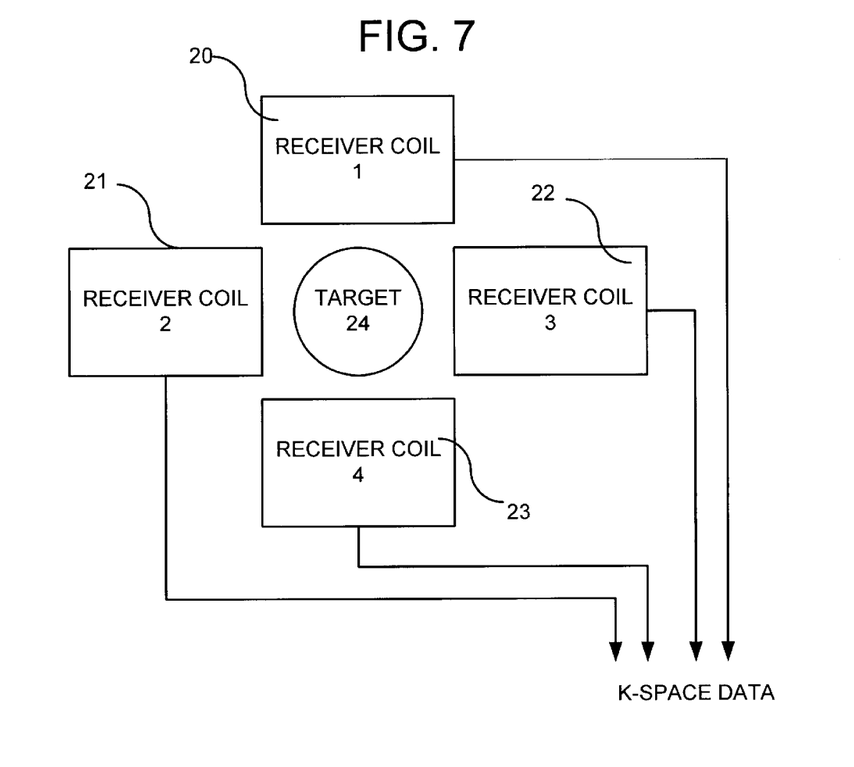
FIG. 7 is a block diagram illustrating the parallel acquisition of k-space data using multiple receiver coils.

FIG. 7 shows that the k-space data is acquired in parallel from multiple receiver coils 20–23 (sometimes called a phased array of coils) placed around the imaged object 24. The number and spatial location of receiver coils varies based on the particular application. The k-space data is applied in parallel to the different embodiments of FIG. 3.

Receiving data in parallel such as shown in FIG. 7 is a technique well-known in SENSE and SMASH.

Figure 4A:
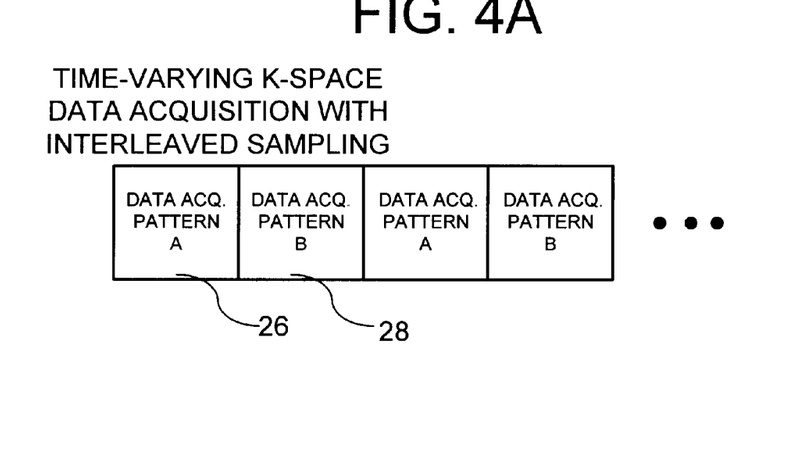
FIGS. 4A and 4B show time-varying, undersampled k-space data sets that may be used in accordance with the invention.
Figure 4B:
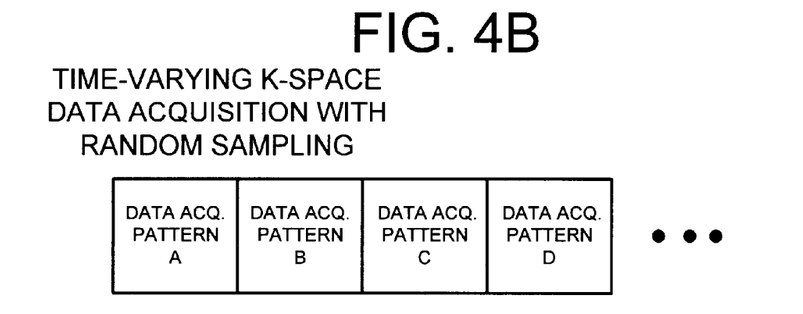

FIGS. 4A and 4B show examples of undersampled, time-varying k-space data applied to the different embodiments of FIG. 3. FIG. 4A shows that the k-space data is divided into data sets, such as data sets 26, 28. Each data set has a data acquisition pattern associated with it. In this case, data set 26 has a pattern generically shown as "A". Data set 28 has a pattern generically shown as "B". The patterns can take a wide variety of forms. For example, pattern A may represent the acquisition of odd lines of k-space data, while pattern B represents the acquisition of even lines of k-space data. Whatever the acquisition pattern, FIG. 4A shows that the overall acquisition is time-varying because the acquisition patterns differ between data sets. Additionally, the overall acquisition is interleaved because the acquisition patterns are repeated every other data set. Interleaving may also take place between larger sets of patterns (e.g., ABCABC . . . or ABCDABCD . . . , AABBAA . . . , etc).

FIG. 4B shows another example of time-varying acquisition of k-space. As with FIG. 4A, the data acquisition pattern is time-varying acquisition because the data sets have different acquisition patterns. However, in this case all of the acquisition patterns are different between the data sets (e.g., random patterns). Ideally, the sampling technique will be time-varying, meaning it does alternate in some respects (even, even, even, etc., is an example of a sampling technique that is not time-varying).

There are a wide-variety of possibilities for the data acquisition. For example, a combination of the two techniques of FIGS. 4A and 4B can be used. Undersampling may also be used in conjunction with other phase encode schemes, such as partial-NEX (where NEX is the number of excitations or k-space lines) or variable density sampling. In the case of partial-NEX, a fraction of k-space is skipped (for instance the 1 st 25%). The remaining lines may be undersampled further by sampling even or odd lines of the remaining fraction of k-space. In the case of variable density sampling, the inner lines of k-space may be sampled at a different spacing than outer lines. For instance, the undersampling using even or odd may be applied to the outer portion of k-space while the inner portion is sampled at the full resolution. Other acquisition techniques (which are too numerous to list) may also be used as is well-known in the art.

Figure 4C:
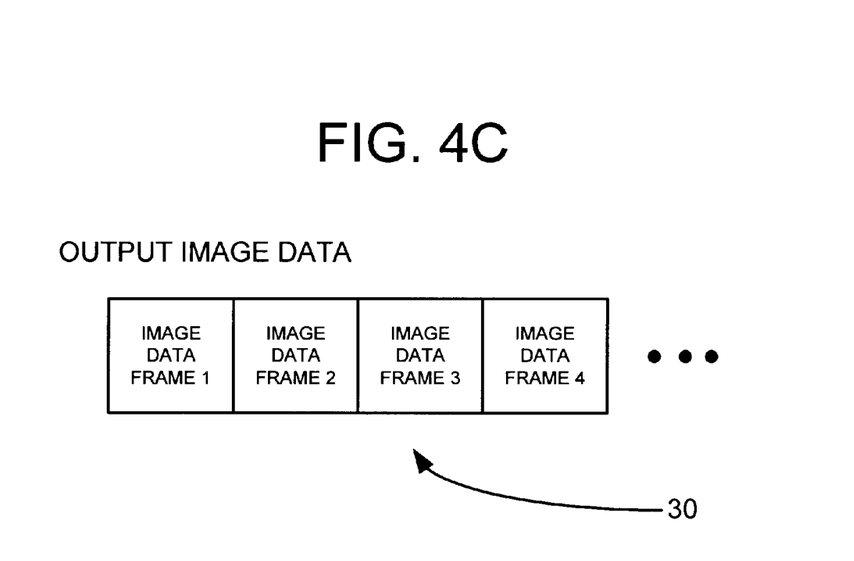
FIG. 4C shows a sequence of images generated from the time-varying k-space data sets of FIGS. 4A, 4B, or some other undersampling scheme.

FIG. 4C shows that regardless of the undersampling scheme chosen, the resultant output is a time sequence of images 30.

Figures 3A, 3B:
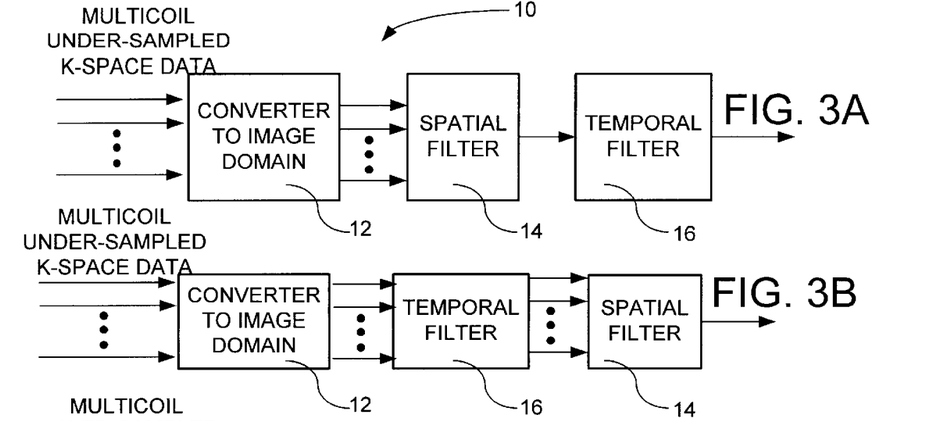
FIGS. 3A–3F show different embodiments of the invention having a series combination of temporal and spatial filters.
Figures 3C, 3D, 3E, 3F:
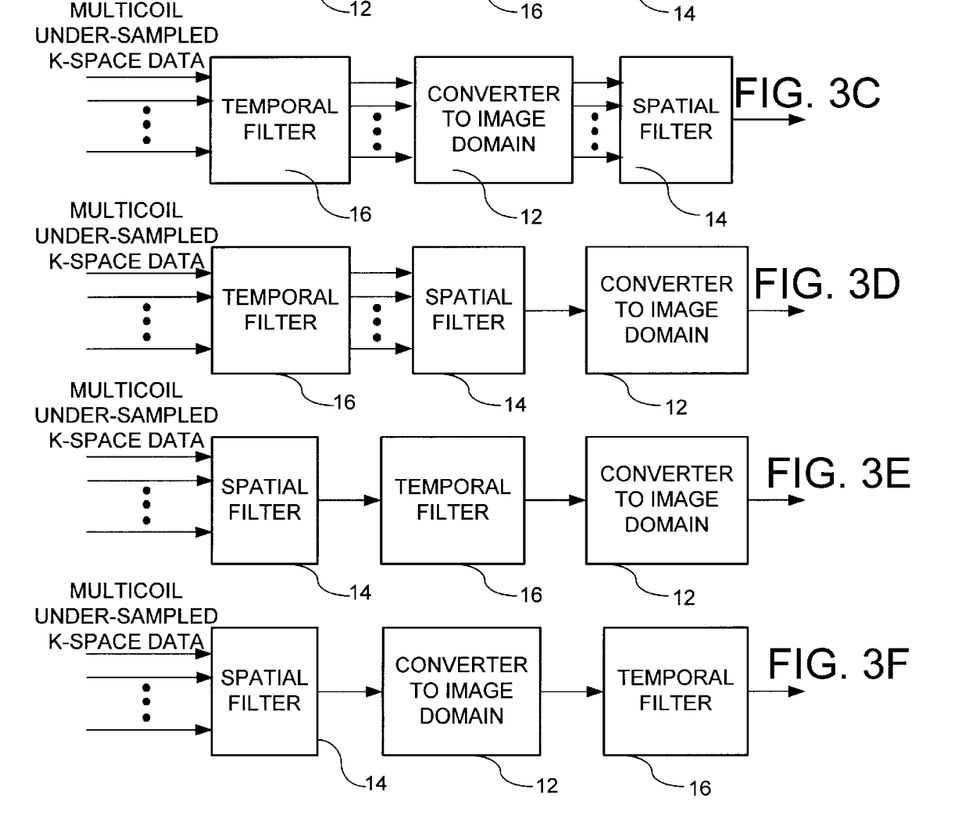

Detailed Example of FIG. 3A Embodiment

In order to limit the length of this description, only FIG. 3A is described further. The general description of FIG. 3A is readily applicable to the remaining embodiments of FIGS. 3B–3F. Additionally, although a generalized example is discussed below for an acceleration rate of R=2, the present invention may be applied to any R-fold acceleration. That is, the number of lines in the phase encode direction of the k-space acquisition may be expanded R-fold in the final reconstruction using a combination of temporal and spatial filters in series. The acceleration factor R is not required to be integer. The acceleration factor which corresponds to the temporal and spatial filtering steps individually may not be equal.

In FIG. 3A, undersampled k-space data is applied to the converter 12 to convert the k-space data to the image domain. The k-space data is supplied by multiple receiver coils (N), as indicated by the multiple input lines to the converter. The converter 12 produces a series of images, each with ghost artifacts. After the image reconstruction, the images may only have a one-half field-of-view (when the acceleration is R=2). The images are passed to spatial filter 14. The spatial filter combines the images together using a weighted sum to produce a single image with the artifacts suppressed. Additionally, the image produced by the spatial filter is a full field-of-view image. The temporal filter 16 receives the full field-of-view image from the spatial filter and further suppresses ghost artifacts. This process is repeated for multiple k-space data sets to produce a sequence of images as shown in FIG. 4C.

By combining both temporal and spatial filtering the resulting implementation achieves a high degree of alias artifact rejection with less stringent requirements on accuracy of coil sensitivity estimates and temporal lowpass filter selectivity than would be required using each method individually. Spatial nulling of alias artifacts is accompanied by noise amplification that results in a loss in signal-to-noise ratio (SNR). Because the degree of spatial nulling or artifact suppression may be relaxed using the combined method, this permits a more flexible design tradeoff between null depth and SNR loss. As an example, one method for achieving this method is accomplished by regularizing the inverse solution to reduce the ill-conditioning.

To further elaborate on the example of FIG. 3A, assume that the spatial filter 14 is a SENSE filter, the temporal filter 16 is an UNFOLD filter, and the k-space data is acquired using an interleaved (alternating) pattern. Additionally, the acceleration is R=2. Of course, the application is not limited to this narrow example and can be applied to other temporal and spatial filters as already described and at an increased rate of acceleration.

The UNFOLD technique is based on acquiring k-space phase encode lines in a time interleaved fashion, i.e., the sequence acquisition alternates between even and odd lines to increase the frame rate by a factor of R=2. The images reconstructed from either the even or odd lines have aliasing, which results from halving the field-of-view. The sign of the aliased component is alternating, thus the aliased component is shifted in temporal frequency and may be rejected by means of lowpass temporal filtering.

The SENSE technique exploits the differences in spatial sensitivity of multiple receiver coils to eliminate the aliased component that results from undersampling k-space. The formulation of R=2 sensitivity encoding (SENSE) may be readily extended to time interleaved k-space acquisition by expressing the reconstructed coil images in matrix form and including the alternating sign of the aliased component:

$$\begin{bmatrix} \tilde{f}_1(x,y,t) \\ \vdots \\ \tilde{f}_N(x,y,t) \end{bmatrix} = \begin{bmatrix} s_1(x,y) & s_1(x, y \pm FOV/2) \\ \vdots & \vdots \\ s_N(x,y) & s_N(x, y \pm FOV/2) \end{bmatrix} \quad [1]$$

$$\begin{bmatrix} f(x,y,t) \\ f(x, y \pm FOV/2, t)(-1)^t \end{bmatrix},$$

where f(x, y, t) represents the desired sequence of images, $\tilde{f}_i$ (x,y,t) is the reconstructed sequence of images for the i-th coil, $s_i$ (x,y) is the complex sensitivity profile for the i-th coil, N denotes the number of coils, and the alternating sign factor $(-1)^t$ is due to the interleaved k-space acquisition. The desired unaliased full-field-of-view images f(x,y,t) may be computed from the measured aliased images $\tilde{f}_i$ (x,y,t), assuming the coil sensitivities are known or estimated with sufficient accuracy. The generalized weighted least squares solution is given by:

$$\hat{f}_{SENSE} = (\hat{S}^H R_n^{-1} \hat{S})^{-1} \hat{S}^H R_n^{-1} \tilde{f} = U \tilde{f}, \quad [2]$$

where $\hat{f}$ denotes the N×1 vector of aliased images (for each coil), $\hat{f}_{SENSE}$ denotes the 2×1 vector estimate of unaliased images, $\hat{S}$ is the estimated sensitivity matrix, $R_n$ is the estimated noise correlation matrix between coils, and U is defined as the unmixing matrix.

The phase of the alias artifact (±1 in this case) which results from the interleaved k-space acquisition order does not alter the SENSE formulation (inverse solution of Eq. 2). However, if the estimates of coil sensitivities are imperfect, there will be residual artifacts. Any residual artifact will be temporally frequency shifted to the band edge and thus may be further suppressed by temporal low pass filtering. It may be readily observed due to the linearity of both UNFOLD and SENSE that the spatial and temporal filtering operations may be performed in either order. Thus, the estimate is defined as:

$$\hat{f}_{TSENSE}(x,y,t)=[\hat{f}_{SENSE}(x,y,t)]_{(1,1)}*h_{LPF}(x,y,t)=[U\hat{f}_{UNFOLD}]_{(1,1)},\quad [3]$$

where $\hat{f}_{UNFOLD, i}(x,y,t)=\hat{f}_i(x,y,t)*h_{LPF}(x,y,t)$ is the temporally filtered image for the i-th coil, $h_{LPF}(x,y,t)$ denotes the temporal lowpass filter impulse response, and the asterisk (*) denotes the temporal convolution operation. In general, the low pass filter response, $h_{LPF}(x,y,t)$, may vary spatially. While either order may be mathematically equivalent, it is computationally advantageous to temporally filter after combining the multiple coils (i.e., perform SENSE followed by UNFOLD).

The principle of UNFOLD is to separate the desired component, $f(x,y,t)$, from the undesired aliased component, $f(x,y\pm FOV/2)(-1)^t$ by means of lowpass temporal filtering. Each pixel in the aliased image is a mixture of 2 components that share the same bandwidth. More bandwidth can be allocated to the desired image component if the aliased image region is relatively static with correspondingly less temporal bandwidth.

Figure 8:
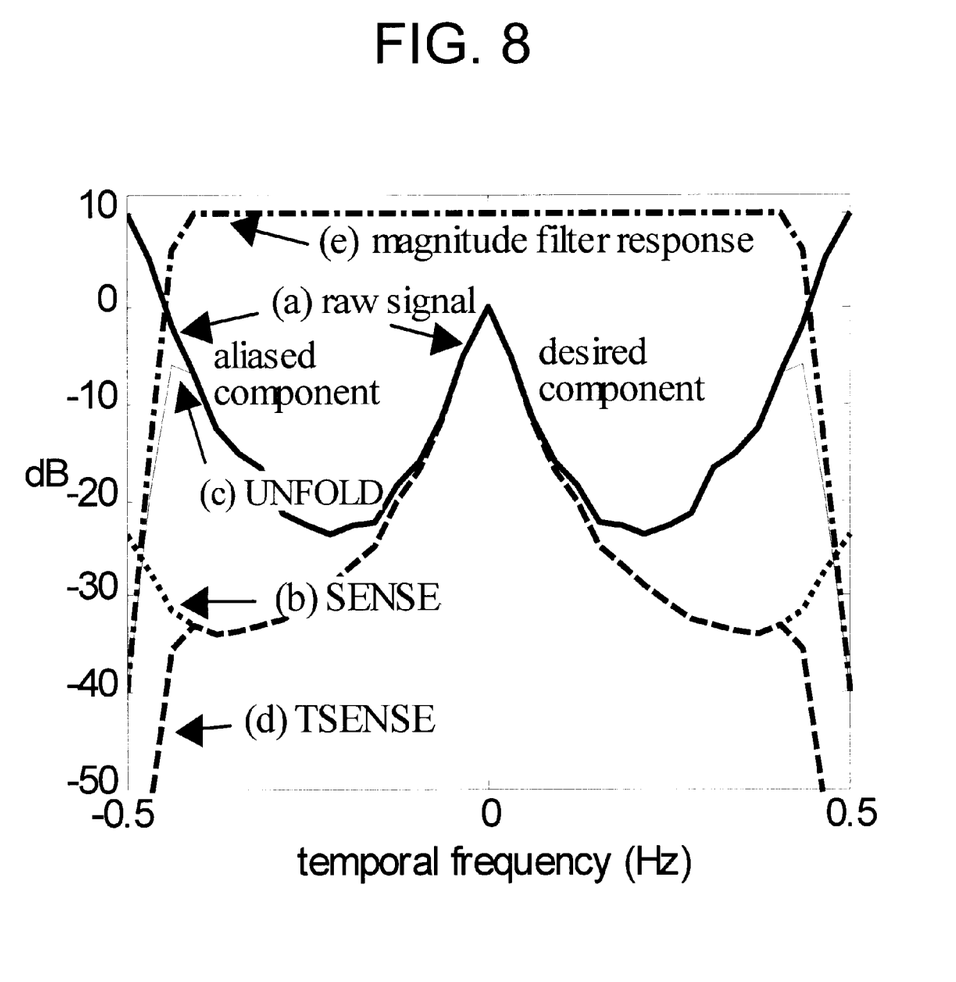
FIG. 8 is a graphic representation showing the average temporal spectrum of a region of interest and comparing an UNFOLD filtering scheme to filtering schemes according to the invention.

FIG. 8 illustrates the temporal spectrum of a pixel with both desired and aliased components. The 2-sided spectra is shown to represent the fact that, in general, the signal is complex and will have an asymmetric spectrum resulting from phase modulation. In this example, chosen to illustrate the benefit of the FIG. 3A embodiment (called TSENSE in FIG. 8), it is assumed that the aliased region has significant motion, and, therefore, the aliased component has a significant bandwidth which overlaps the spectrum of the desired component. This violates the typical assumption that when using UNFOLD the peripheral field-of-view should be relatively static. The use of the UNFOLD method by itself cannot completely suppress the artifact if it is to provide the increase in bandwidth commensurate with the accelerated imaging speed. However, temporal lowpass filtering (UNFOLD) does provide a high degree of suppression at the band edge where the aliased component is the strongest. The SENSE method provides suppression of the aliased component which is more uniform across the temporal spectrum (assuming relatively static coil sensitivities).

While the central portion of field-of-view is typically more dynamic (in some applications) with correspondingly greater temporal bandwidth, the alias artifact due to the central field-of-view is weaker since it is further from the surface coils. Therefore, even in the peripheral field-of-view, spatial filtering should be able to provide the required suppression within the temporal passband. The method still benefits from temporal lowpass suppression of the stronger average alias component at the band edge. Therefore, the lowpass filter may have a fixed (wide) bandwidth over the full field-of-view, in contrast with the normal UNFOLD bandwidth sharing assumption. In this case, temporal filtering may be performed in either the image or k-space domains (equivalent to viewsharing or some Fourier interpolations schemes).

The loss in signal-to-noise ratio (SNR) for reduced k-space acquisition relative to the full k-space acquisition is proportional to the square root of the acceleration factor, R. The expression for SNR is given as:

$$SNR_{TSENSE} = \frac{1}{G_{SENSE}}\sqrt{\frac{BW_{FULL}}{BW_{UNFOLD}}}\sqrt{\frac{1}{R}}SNR_{FULL},\quad [4]$$

where $BW_{FULL}$ which equals the sample rate and $BW_{UNFOLD}=\int|H(f)|^2 df/|H(0)|^2$ for lowpass filter H(f) are the 2-sided noise equivalent temporal bandwidths for full and reduced FOV k-space acquisitions, respectively, and $G_{SENSE}$ is the noise amplification factor which results from the inverse solution. The slight loss in temporal bandwidth due to the UNFOLD lowpass filter results in a slight SNR gain ($BW_{UNFOLD}/BW_{FULL}$ is typically 0.8). The SNR loss ($1/G_{SENSE}$) due to the ill conditioning of the coil sensitivity matrix depends on the x,y position, the specific array geometry, and the acceleration factor.

Dynamically Computing Sensitivity Coefficients

In environments with multiple coils, the spatial filter coefficients are needed to properly apply a spatial filter. In prior methods, calibration runs were performed prior and/or subsequent to imaging in order to obtain an estimate of the coefficients. Unfortunately, the coil sensitivities can change during the imaging time if the object (patient) moves even small amounts. Consequently, prior techniques often have inaccurate spatial filter coefficients during imaging.

The present invention provides a technique for adaptively or dynamically computing the spatial filter coefficients. Thus, the spatial filter coefficients are computed on-the-fly and substantially at the same time as the spatial filter is generating the sequence of images.

Figure 5A:
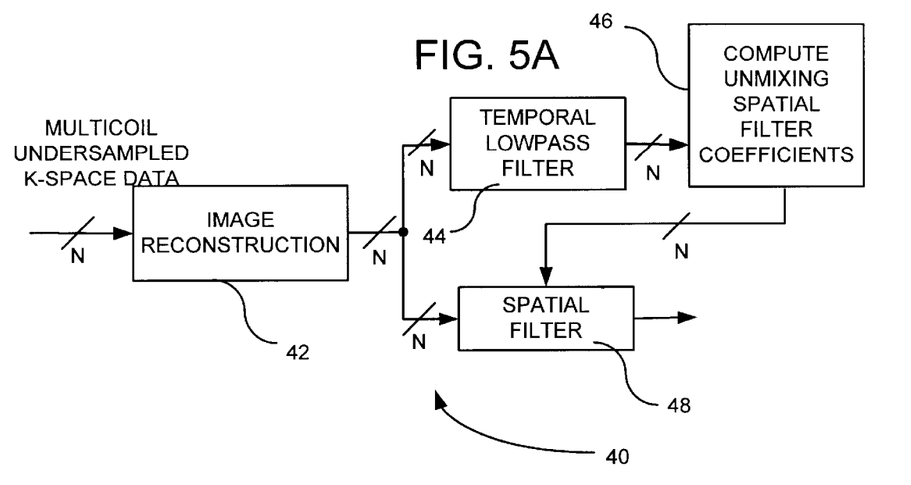
FIG. 5A is a block diagram according to the invention illustrating an adaptive or dynamic computation of sensitivity coefficients used in a spatial filter.

FIG. 5A shows an example of the system 40 for dynamically computing spatial filter coefficients. Multicoil, time varying, undersampled k-space data is passed through an image reconstructor 42, such as a fast Fourier transform. Instead of showing multiple lines as in FIG. 3, the number of lines in FIGS. 5 and 6 are shown generically as N. The image data is then passed along two parallel paths. Along one path, the image data is passed through a temporal lowpass filter 44. This temporal lowpass filter typically has a relatively low bandwidth to ensure that residual artifacts are removed. After passing through temporal lowpass filter 44, the image data is passed to a process block 46 that computes the spatial filter coefficients. The dynamically computed coefficients are passed to a spatial filter 48, which is also simultaneously receiving the image data passed to temporal filter 44. Consequently the spatial filter is receiving dynamically computed coefficients. The spatial filter is similar to the spatial filters already described. In certain cases (not shown in FIG. 5A), such as partial-NEX acquisition, the spatial resolution of the series of images used for computing spatial filter coefficients may be different than that used for final image reconstruction.

Figure 5B:
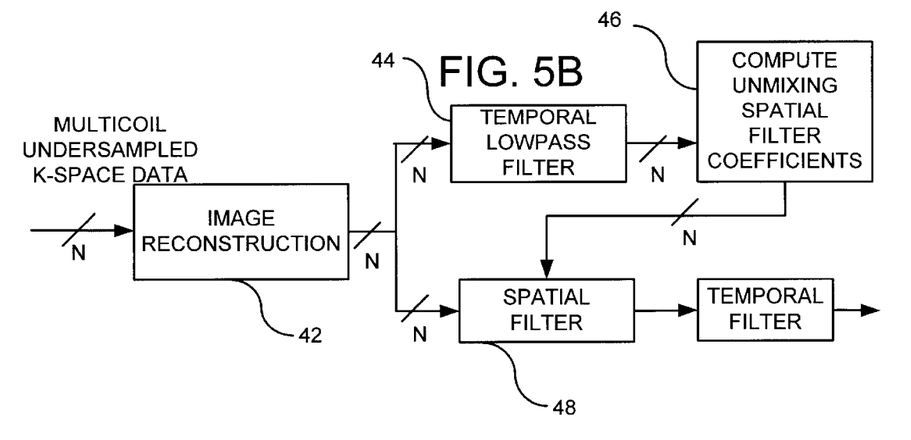
FIG. 5B is a block diagram according to the invention for dynamically computing sensitivity coefficients as in FIG. 5A, but with an additional temporal filter for further suppressing ghost artifacts.

As shown in FIG. 5B, the same technique can be used with a spatial filter and temporal filter combined in series.

Figure 6:
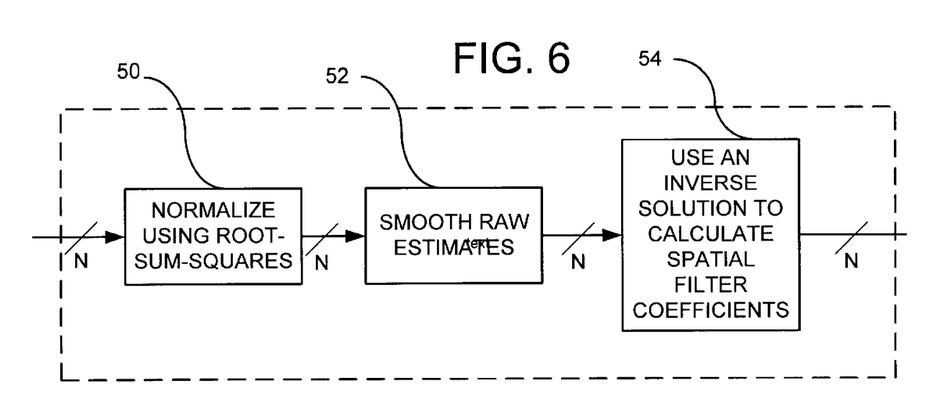
FIG. 6 is a detailed block diagram further illustrating one technique for computing the coefficients of FIGS. 5A and 5B.

FIG. 6 shows a diagram further elaborating on one way in which the sensitivity coefficients may be calculated. There are numerous ways to compute sensitivity coefficients. FIG. 6 shows an example of only one such technique. Those skilled in the art will readily recognize alternative techniques that can be used.

After receiving the image data from the temporal lowpass filter, the data is normalized using the root sum of squares image to obtain the raw complex sensitivity maps (process block 50). The maps are then spatially smoothed to further enhance the sensitivity maps if required (process block 52). Finally, a general inverse solution to calculate the spatial coefficients (process block 54).

Having illustrated and described the principles of the illustrated embodiments, it will be apparent to those skilled in the art that the embodiments can be modified in arrangement and detail without departing from such principles.

For example, although the spatial and temporal filters are shown directly coupled together, there may exist intermediate components of hardware or software.

Additionally, the different elements embodying the invention can be performed in hardware, software, or a combination thereof.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

We claim:

1. A method for acceleration of magnetic resonance imaging to produce a series of images, comprising:

acquiring undersampled data in a magnetic resonance imaging environment; and filtering the undersampled data using a series combination of a temporal filter and a spatial filter to produce the series of images with suppressed artifacts.

2. The method of claim 1, wherein the undersampled data is acquired using an array of receiver coils.

3. The method of claim 2, wherein the undersampled data is in k-space and is acquired using phase encodes in an interleaved manner.

4. The method of claim 1, wherein the data is k-space data and the method further includes performing image reconstruction on the k-space data to convert the data into an image with ghost artifacts.

5. The method of claim 4, wherein the temporal and spatial filters suppress the ghost artifacts.

6. The method of claim 4, wherein the image reconstruction is achieved using a fast Fourier transform.

7. The method of claim 1, further including performing image reconstruction on the data in series with the temporal and spatial filters.

8. The method of claim 7, wherein the temporal filtering, spatial filtering and image reconstruction can occur in any order.

9. The method of claim 1, wherein the undersampled data is k-space data and a phase encode ordering used for undersampling the k-space data is time varying.

10. The method of claim 1, wherein an R-fold acceleration is achieved.

11. The method of claim 1, wherein at least one of the temporal and spatial filters receive images that are full field-of-view images.

12. A method for acceleration of magnetic resonance imaging to produce a series of images, comprising:

acquiring undersampled data from multiple coils in a magnetic resonance imaging environment;

filtering the undersampled data using a spatial filter to suppress artifacts; and dynamically computing spatial filter coefficients and applying the dynamically computed spatial filter coefficients to the spatial filter while generating the series of images;

wherein the undersampled data is k-space data and a phase encode ordering used for undersampling the k-space data is time varying, and multiple coils are used to acquire the k-space data.

13. The method of claim 12, further including filtering the undersampled data using a temporal filter combined in series with, the spatial filter.

14. The method of claim 12, further including converting the k-space data to the image domain using a fast Fourier transform.

15. The method of claim 12, wherein dynamically computing the spatial filter coefficients includes filtering the image domain data with a temporal low-pass filter.

16. The method of claim 12, wherein dynamically computing spatial filter coefficients includes normalizing the image domain data, smoothing the normalized image domain data, and calculating the coefficients using an inverse solution.

17. The method of claim 12, wherein the dynamically computed spatial coefficients are computed at substantially the same time that the series of images are generated.

18. A system for acceleration of magnetic resonance imaging to produce a series of images, comprising:

multiple coils placed near a target to be imaged that receive k-space data representative of the target in the frequency domain;

an image reconstructor that receives the k-space data and converts the k-space data to the image domain; and a spatial filter and a temporal filter coupled together in series and coupled in series to the image reconstructor, the spatial and temporal filters combining to suppress ghost artifacts caused by undersampling and to generate an output series of images.

19. The system of claim 16, wherein the spatial filter, temporal filter and image reconstructor can occur in any order.

* * * * *

UNITED STATES PATENT AND TRADEMARK OFFICE
CERTIFICATE OF CORRECTION

PATENT NO. : 6,556,009 B2  
APPLICATION NO. : 09/735263  
DATED : April 29, 2003  
INVENTOR(S) : Kellman et al.

It is certified that error appears in the above-identified patent and that said Letters Patent is hereby corrected as shown below:

In the Specification:

Column 5, line 36, "1 st" should be --1st--.

Column 6, line 67, Column 7, lines 1-5,

" $$\hat{f}_{SENSE} = (\hat{S}^H R_n^{-1} \hat{S})^{-1} \hat{S}^H R_n^{-1} f = Uf ,\qquad [2]$$

where $\tilde{f}$ denotes the $N \times 1$ vector of aliased images (for each coil), $\hat{f}_{SENSE}$ denotes the $2 \times 1$ vector estimate of unaliased images, $\hat{S}$ is the estimated sensitivity matrix, $R_n$ is the estimated noise correlation matrix between coils, and U is defined as the unmixing matrix."

should read $$--\hat{f}_{SENSE} = (\hat{S}^H R_n^{-1} \hat{S})^{-1} \hat{S}^H R_n^{-1} \tilde{f} = U \tilde{f} \qquad [2]$$

where $\tilde{f}$ denotes the $N \times 1$ vector of aliased images (for each coil), $\hat{f}_{SENSE}$ denotes the $2 \times 1$ vector estimate of unaliased images, $\hat{S}$ is the estimated sensitivity matrix, $\mathbf{R_n}$ is the estimated noise correlation matrix between coils, and U is defined as the unmixing matrix.--

Column 7, line 17,

" $$\hat{f}_{TSENSE}(x,y,t) = [\hat{f}_{SENSE}(x,y,t)]_{(1,1)} * h_{LPF}(x,y,t) = [U\hat{f}_{UNFOLD}]_{(1,1)},\qquad [3]$$ "

should read $$-- \hat{f}_{TSENSE}(x,y,t) = \left[\hat{f}_{SENSE}(x,y,t)\right]_{(1,1)} * h_{LPF}(x,y,t) = \left[U\hat{f}_{UNFOLD}\right]_{(1,1)},\qquad [3] --.$$

UNITED STATES PATENT AND TRADEMARK OFFICE
CERTIFICATE OF CORRECTION

| | |
|---|---|
| PATENT NO. | : 6,556,009 B2 |
| APPLICATION NO. | : 09/735263 |
| DATED | : April 29, 2003 |
| INVENTOR(S) | : Kellman et al. |

It is certified that error appears in the above-identified patent and that said Letters Patent is hereby corrected as shown below:

In the Claims:

Claim 19, Column 10, line 50, "claim 16" should be --claim 18--.

Signed and Sealed this

Seventeenth Day of October, 2006

JON W. DUDAS
*Director of the United States Patent and Trademark Office*